United States Patent [19]

Treise et al.

[11] Patent Number: 4,484,296
[45] Date of Patent: Nov. 20, 1984

[54] PHASE PROGRAMMABLE SIGNAL GENERATOR MEANS

[75] Inventors: Jan E. Treise, W. Melbourne; Orville K. Nyhus, Melbourne, both of Fla.

[73] Assignee: Rockwell International Corporation, El Segundo, Calif.

[21] Appl. No.: 399,676

[22] Filed: Jul. 19, 1982

[51] Int. Cl.³ .......................................... H03B 19/00
[52] U.S. Cl. .................... 364/607; 364/721; 328/14
[58] Field of Search .............. 364/607, 721, 718, 608; 328/14

[56] References Cited

U.S. PATENT DOCUMENTS

| | | | |
|---|---|---|---|
| 4,134,072 | 1/1979 | Bolger | 340/347 X |
| 4,172,286 | 10/1979 | Wess | 364/722 X |
| 4,192,007 | 3/1980 | Becker | 364/721 |
| 4,346,448 | 8/1982 | Insam et al. | 364/721 X |
| 4,349,887 | 9/1982 | Crowley | 364/721 X |
| 4,410,955 | 10/1983 | Burke et al. | 328/14 X |

Primary Examiner—Jerry Smith
Assistant Examiner—Allen MacDonald
Attorney, Agent, or Firm—Bruce C. Lutz; Robert C. Mayes; H. Fredrick Hamann

[57] ABSTRACT

A phase controlled signal generator using a cyclical counter with preset and reset control terminals to provide a continually advancing digital signal. This digital signal is converted in a sine table PROM and D to A converter to a sine wave signal which signal has a phase shift with respect to a reference in accordance with a phase control preset input and which signal can be periodically synchronized to a given starting phase to maintain signal stability or Doppler frequency shift.

7 Claims, 2 Drawing Figures

PHASE PROGRAMMABLE SIGNAL GENERATOR MEANS

THE INVENTION

The present invention is generally concerned with electronics and more specifically concerned with the generation of a sine-wave signal. Even more specifically, the present invention is concerned with the digital generation of a sine-wave signal whose output phase can be easily controlled and whose zero crossing or other reference time can be easily reset.

BACKGROUND OF INVENTION

Equipment required for new VLF/Omega global navigation systems requires the production of sophisticated test apparatus for simulating the complex network of VLF (Very Low Frequency) and Omega signals to adequately test the operability of the equipment. In order to simulate these signals, precise phase control is necessary along with the capability of individual Doppler frequency phase shifting to simulate motion along a ground track. The present invention illustrates a new and simple approach to providing said phase control and Doppler shift with a minimum of components.

A digital clock is generated whose frequency is $2^N$ times that of the desired signal. The digital clock increments an N-bit counter whose outputs are applied to address a sine look-up table PROM (Programmable Read Only Memory). The PROM outputs drive a digital analog converter which produces a step approximation to the desired signal. These steps are then removed by filtering to provide the desired sine-wave output signal. A phase offset may be obtained by presetting the N-bit counter to some given state by a synchronizing signal which is a sub-multiple of the desired output. Then a multiple number of such signal generators are connected to form the complex signal conditions under which the equipment must operate. There must be a synchronization of all the generators such that the phase relationship between all the signals can be precisely defined. This is accomplished by making the synchronizing signal a sub-multiple of all the signals that must be generated.

By incrementally changing the preset count of the phase counter over a period of time, the phase of the output signal will increase or decrease giving an apparent frequency shift.

The present system is more stable and uses fewer parts than prior art attempts at phase controlled signal generators using variable frequency VCO's (Variable Controlled Oscillator) and pulse stuffer and dropper techniques to achieve phase shift and Doppler frequency shift.

It is therefore an object of the present invention to provide an improved phase controlled signal generator.

Other objects and advantages of the present invention may be ascertained from a reading of the specification and appended claims in conjunction with the drawings wherein:

FIG. 1 is a block diagram of the inventive concept for generating a phase controlled signal; and FIG. 2 is a block diagram of a test simulator system incorporating the basic inventive concept.

DETAILED DESCRIPTION

Figure 1:
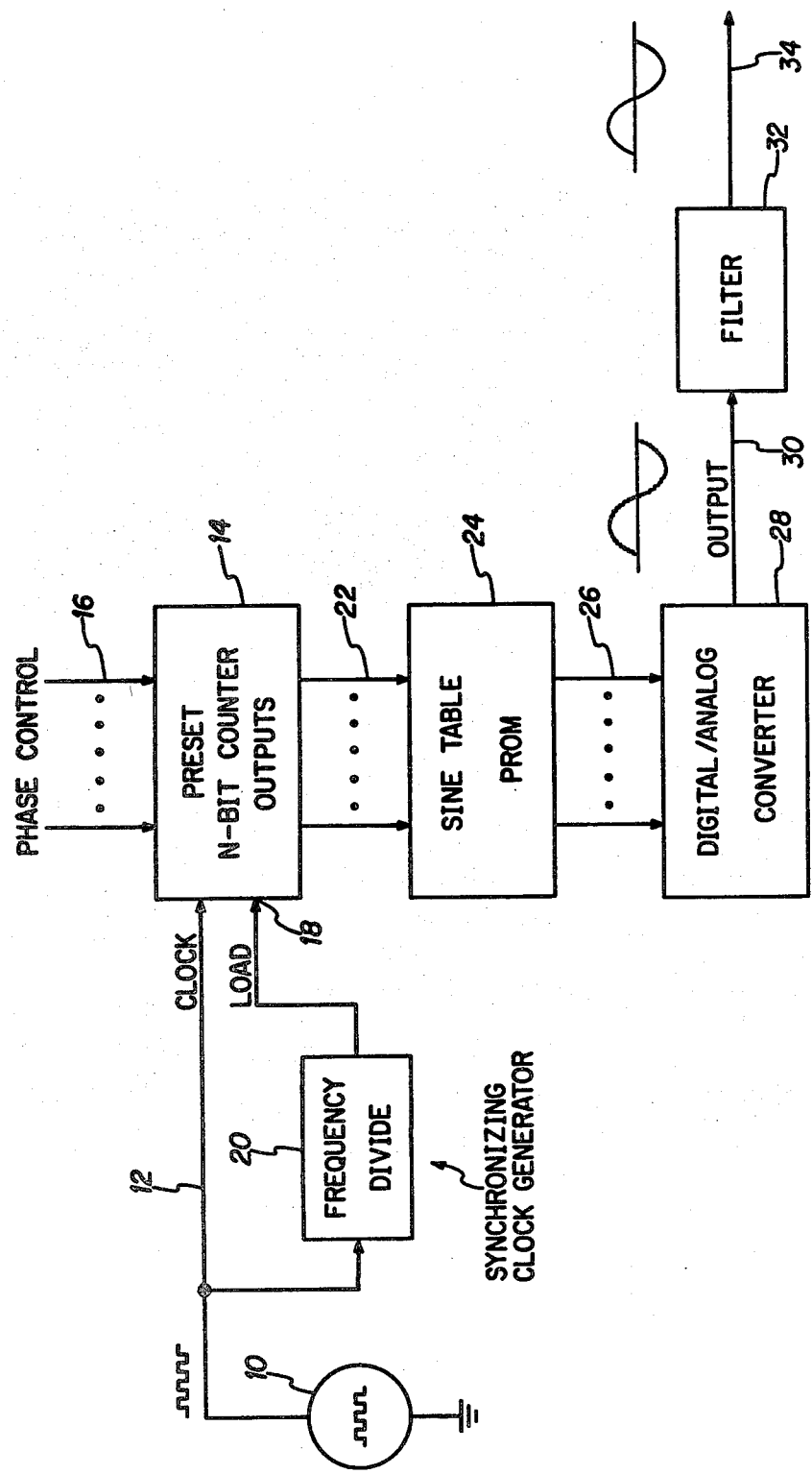

In FIG. 1 a clock signal is supplied by a clock 10 on a line 12 to a counter 14. Counter 14 has a preset or phase control signal input 16 and a synchronizing input 18. A frequency divider 20 is shown connected between lead 12 and input 18 of counter 14. The counter 14 is a counter of the type whose output recycles, overflows or changes back to zero when it reaches a maximum or is actuated by a reset signal. A plurality of outputs from counter 14 are illustrated as leads 22 which supply signals to a sine table PROM 24. Prom 24 has a plurality of outputs 26 supplying signals to D to A converter 28. An output lead 30 supplies step incremented signals between D to A converter 28 and a filter 32 which has a sine-wave output 34.

Figure 2:
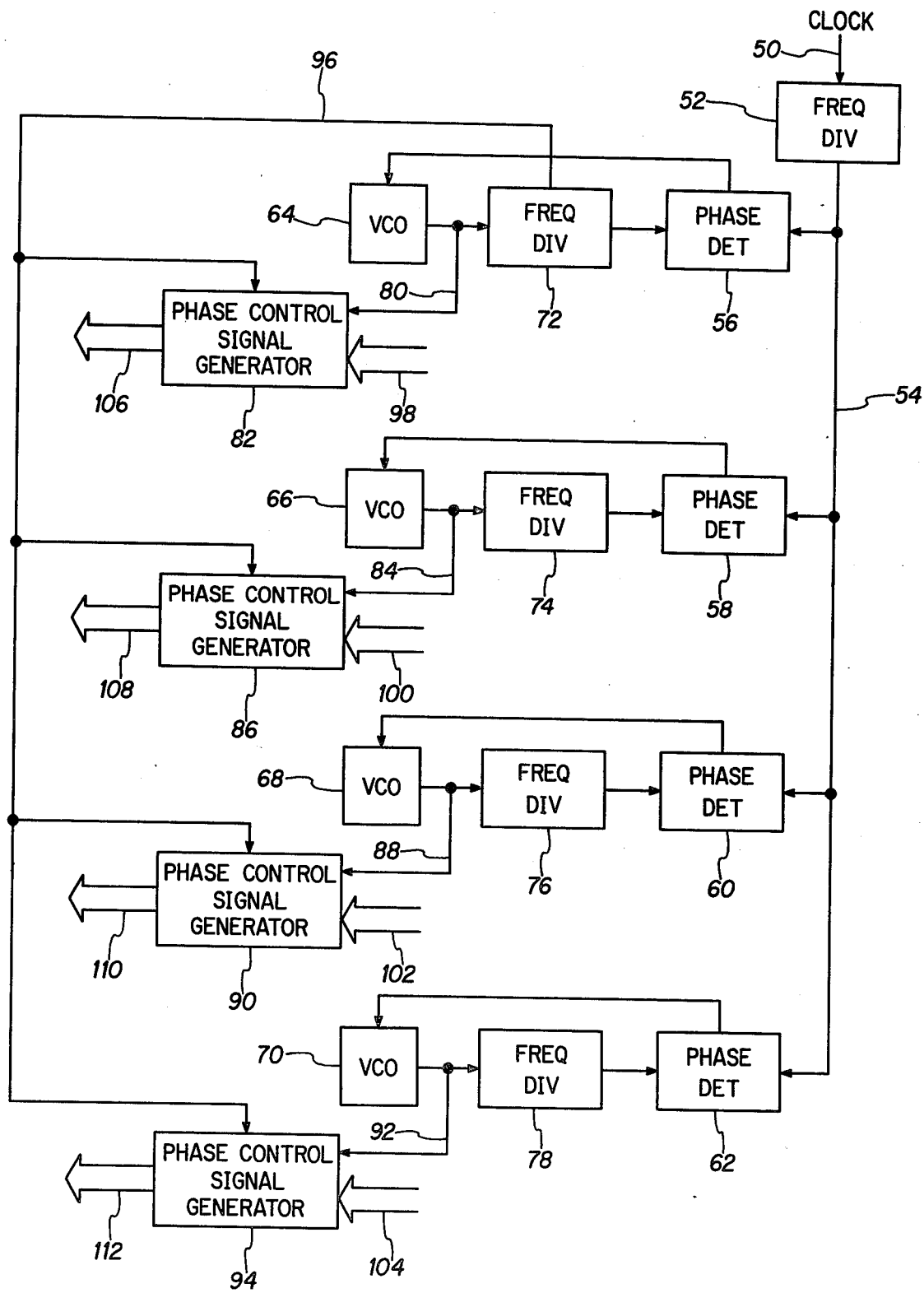

In FIG. 2 a high frequency clock signal is input on a lead 50 to a frequency divide block 52 which supplies stable clock signals on a lead 54 to a plurality of phase detector blocks 56, 58, 60 and 62. Each of the phase detectors has an output signal supplied to a VCO. The VCO's 64, 66, 68 and 70 are shown receiving signals respectively from phase detectors 56, 68, 60 and 62. A plurality of frequency dividers 72, 74, 76 and 78 are illustrated connected between the VCO's and the phase detectors previously referenced. A lead 80 is connected from the output of VCO 64 to an input of a phase controlled signal generator 82. A lead 84 is connected from an output of VCO 66 to an input of a phase controlled signal generator 86. A lead 88 is connected from an output of VCO 68 to an input of a phase controlled signal generator 90 while a lead 92 is connected from an output VCO 70 to an input of a phase controlled signal generator 94. An output of frequency divider 72, which is very low in frequency as compared to the other signals on the leads in FIG. 2, is output on a lead 96 and supplied as a synchronizing input to each of the signal generators 82, 86, 90 and 94. As will also be noted, phase control input leads 98, 100, 102 and 104 supply phase control signals to preset signal inputs of each of the phase controlled signal generators 82, 86, 90 and 94, respectively. As further illustrated, these generators 82, 86, 90 and 94 have parallel output leads 106, 108, 110 and 112, respectively.

The counter 14 of FIG. 1 may be any type of recycling counter having the capability of a preset input. A counter used in one embodiment of the invention comprised two four-bit programmable counters having part number 74 LS 161 and sold by National Semiconductor. The digital-to-analog converter 28 in the same embodiment was a National Semiconductor device having part number 1408. The PROM 24 can be any PROM which is programmed to have a given signal amplitude digital output with a given set of input signals representing a given count or phase.

OPERATION

As referenced above, the counter 14 can be any programmable recycling counter. By recycling, I mean a counter which, when it reaches a given maximum capability of digital output values, provides a next count which is a minimum or "0" value. The counter also requires the capability to practice the present inventive concept of being reset or phase synchronized with a signal such as that input at 18 from the synchronizing clock generator 20 and being designed to accept an input via leads 16 to preset or precondition the output magnitude for the first clock pulse after the synchronizing signal is received. In one embodiment of the invention, the counter 14 provided outputs ranging from digital 0 to digital 255. If the phase control input leads 16 provide a "0" count input, the actuation of the counter from input 18 will then start the counter output on leads 22 and a "0" count. If, on the other hand, the input signal on leads 16 is set at "64", the output on leads 22 will be a count of "65" after receiving the first clock pulse on lead 12. In the first referenced example, the sine table PROM 24 will convert the "0" count input to a zero crossing signal amplitude which also is a "0" magnitude. This "0" magnitude will be converted by converter 28 to a zero crossing amplitude output signal. The next clock input will raise this by one step to the sine magnitude of an angle of 1.4 degrees which is 1/256th of the number of the electrical degrees in one cycle of a sine wave. In the second example, with a count of "64", the sine PROM table will convert this digital count input to an output magnitude representative of an angle of 90 degrees or maximum amplitude in the positive direction. Thus, the first output by digital-to-analog converter 28 would be a 90 degree amplitude signal or the commencement of a cosine signal rather than a sine-wave signal. In any event, the remaining pulses from clock lead 12 result in incremental changes in output equivalent to that produced by 1.4 degree steps. These steps in the sine-wave output from converter 28 are smoothed by filter 32 to provide a waveform corresponding to that shown on lead 34. In one embodiment of the invention, the frequency of clock 12 was in the neighborhood of several megahertz while the synchronizing signal was approximately 16 hertz or approximately 0.001% of the clock frequency. Thus, the synchronizing signals occurred once every 36 cycles of the output signal on lead 34. With this approach, the output signal is periodically resynchronized to a given starting position to control possible error buildup in the D to A converter 28, or in one embodiment of the invention to allow for apparent Doppler shift of the signal. Simulation of the Doppler shift may be accomplished by changing the phase control preset signal value input on leads 16 immediately prior to resynchronization via input 18 since the Doppler shift frequency is much lower than the frequency of the resynchronizing signal.

Referring to FIG. 2 it will be noted that the frequency divided input clock output by divider 52 is applied to a plurality of phase lock loops each employing a phase detector and a VCO along with a frequency divider. The frequency dividers are designed so that the signals applied to the four phase controlled signal generators 82, 86, 90 and 94 have slightly different values. In one embodiment of the inventive concept, these ranged from 2.6 megahertz to 3.48 megahertz. The preset phase input signal on leads 98 through 104 in one embodiment are individually programmable for each generator to simulate the conditions encountered by VLF/Omega equipment. Thus, each of the phase controlled signal generators is supplying an output signal of a different frequency, preset to a given relative phase at that frequency and each controlled accurately relative to the signals supplied by the other signal generators.

Doppler shift of the receiving equipment can also be simulated by the apparatus of FIG. 2 by changing the preset count on the input 98 through 104 over a period of time. Since the equipment used will be on a moving piece of equipment such as an airplane or ship, Doppler frequency shift must be accounted for by the equipment. With the phase of the output signal on leads 106 through 112 changing, the equipment believes it is seeing a frequency shift. In typical aircraft situations, the Doppler shift velocities are very small and normally in the range of 0.0001%. Thus, the phase change required from one counter preset condition to the next is very small.

In summary, the present inventive concept counts input clock signals in a recycling counter whose output magnitude can be affected by a preset input. These outputs can be representative of increments of an electrical angle from 0 to 360 degrees. If these outputs are applied to a sine table PROM, these electrical phase representative signals can be converted to sine wave-amplitude signals representative of the angle inputs. These signals in digital format can be changed to an analog signal by a D to A converter. The step function outputs can then be smoothed by a filter such as 32.

The use of digital signals from a common source to activate a plurality of phase lock loops each of which can has its own phase increment can then be used to simulate conditions occurring in the use of VLF/Omega type equipment in the field including the simulation of Doppler shift by varying the preset phase angles supplied to the phase controlled signal generators. While we have illustrated one embodiment of the inventive concept, it is realized that other embodiments will occur to those skilled in the art. Therefore, we wish to be limited not by the single embodiment illustrated, but only by the scope of the appended claims wherein we claim.

We claim:

1. Phase programmable signal generator means comprising, in combination:
    first means for supplying a clock signal;
    signal supply second means for supplying a phase control signal;
    third means for supplying a synchronizing signal;
    counter means including phase control signal input means, synchronizing signal input means, clock signal input means and digital output signal means for supplying digital output signals which change when a clock signal is applied to said clock signal input means and which change in relative phase in accordance with signals received at said phase control signal input means;
    means for receiving signals from said first, second, and third means at appropriate inputs of said counter means, the synchronizing signal acting to resynchronize the counter output signal after phase shift changes; and
    conversion means, connected to said digital output signal means of said counter means, for changing received digital output signals to an analog representation of a trigonometric function of the received digital number signal.

2. Apparatus as claimed in claim 1 wherein said conversion means comprises:
    sine table look-up means for converting said digital output signals into digital sine function representation signals;
    digital-to-analog conversion means for converting the sine function representation signals to a multiple step function approximation of a sine-wave signal; and
    filter means for filtering the converted signal to a stepless representation of a sine-wave signal.

3. The method of generating a phase controlled signal comprising the steps of:
    supplying clock input signals;
    supplying a phase control offset signal;

outputting a digital output signal which cyclically resets to zero as an accumulated sum of clock and phase offset signals; and converting said digital output signal in accordance with a sine function to an analog output signal.

4. Apparatus for generating a phase controlled signal comprising, in combination:

first means for supplying clock input signals;

signal supply second means for supplying a phase control offset signal;

third means, connected to said first and second means for receiving input signals therefrom and for outputting a digital output signal which cyclically resets to zero as an accumulated sum of clock and phase offset signals; and fourth means, connected to said third means for receiving said digital output signal therefrom and for converting said digital output signal in accordance with a sine function to an analog output signal.

5. The method of generating a phase controllable signal comprising the steps of:

supplying clock input signals;

supplying a phase control signal;

outputting a digital output signal which cycles between given minimum and maximum values as an accumulated sum of clock and phase signals; and converting said digital output signal in accordance with a trigonometric function to an analog output signal.

6. Apparatus for generating a phase controllable signal comprising, in combination:

first means for supplying clock input signals;

signal supply second means for supplying a phase control signal;

third means, connected to said first and second means for receiving input signals therefrom and for outputting a digital output signal which cycles between predetermined minimum and maximum values as an accumulated sum of clock and phase signals; and fourth means, connected to said third means for receiving said digital output signal therefrom and for converting said digital output signal in accordance with a trigonometric function to an analog output signal.

7. Apparatus for simulating a multifrequency field environment condition comprising, in combination:

clock means for supplying a first clock signal;

a plurality of phase lock loop means, each of said phase lock loop means including at least one clock signal output means for supplying a modified clock signal and reference signal input means connected to said clock means for receiving said first clock signal therefrom;

a plurality of phase controlled signal generator means, including phase preset signal input means, clock input means and digital signal output means, connected to receive modified clock signals from corresponding ones of said phase lock loop;

means for supplying phase reference synchronizing signals to said plurality of generator means from one of said phase lock loop means; and a plurality of phase preset signal supply means, connected to corresponding inputs of said generator means, for supplying phase preset signals thereto.

* * * * *